(12) United States Patent
Iwasaki et al.

(10) Patent No.: US 7,956,346 B2
(45) Date of Patent: Jun. 7, 2011

(54) LIGHT EMITTING DEVICE HAVING LIGHT EMISSION AND MICROSTRUCTURE LAYERS BETWEEN ELECTRODE LAYERS

(75) Inventors: Tatsuya Iwasaki, Machida (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/371,909

(22) Filed: Mar. 10, 2006

(65) Prior Publication Data

US 2006/0220035 A1 Oct. 5, 2006

(30) Foreign Application Priority Data

Mar. 17, 2005 (JP) .................................. 2005-077862

(51) Int. Cl.
*H01L 29/06* (2006.01)
(52) U.S. Cl. ............................................. 257/13; 257/79
(58) Field of Classification Search .................. 257/79, 257/13
See application file for complete search history.

(56) References Cited

U.S. PATENT DOCUMENTS

| | | | | |
|---|---|---|---|---|
| 5,660,697 A | * | 8/1997 | Kawashima et al. | .... 204/192.22 |
| 5,739,545 A | * | 4/1998 | Guha et al. | ...................... 257/40 |
| 5,952,040 A | * | 9/1999 | Yadav et al. | ............... 427/126.3 |
| 6,801,352 B2 | | 10/2004 | Okura et al. | .................. 359/253 |
| 7,265,375 B2 | * | 9/2007 | Zhang et al. | ..................... 257/15 |
| 2001/0011868 A1 | * | 8/2001 | Fukunaga et al. | ............ 313/506 |
| 2004/0091815 A1 | * | 5/2004 | Yamamoto et al. | ...... 430/270.13 |
| 2004/0217702 A1 | * | 11/2004 | Garner et al. | ................. 313/512 |
| 2004/0232410 A9 | * | 11/2004 | Dahmani et al. | ................ 257/40 |
| 2004/0246408 A1 | | 12/2004 | Ando et al. | .................... 349/100 |
| 2005/0019602 A1 | * | 1/2005 | Sellinger | ........................ 428/690 |
| 2005/0161696 A1 | * | 7/2005 | Yuri | ........................... 257/103 |
| 2006/0043410 A1 | * | 3/2006 | Iwasaki et al. | ................ 257/103 |

FOREIGN PATENT DOCUMENTS

| | | |
|---|---|---|
| JP | 2000-200686 A | 7/2000 |
| JP | 2001-023509 A | 1/2001 |
| JP | 2001-319787 | 11/2001 |
| JP | 2003-115385 | 4/2003 |

* cited by examiner

*Primary Examiner* — Wai-Sing Louie
*Assistant Examiner* — Bilkis Jahan
(74) *Attorney, Agent, or Firm* — Fitzpatrick, Cella, Harper & Scinto

(57) ABSTRACT

A light emitting device includes a substrate, a first electrode layer, a light emitting layer, a structure layer and a second electrode layer. The structure layer has first domains composed of a first material having a columnar shape and second domains composed of a second material, and on the substrate the structure layer and the light emitting layer are laminated between the first electrode layer and the second electrode layer.

11 Claims, 6 Drawing Sheets

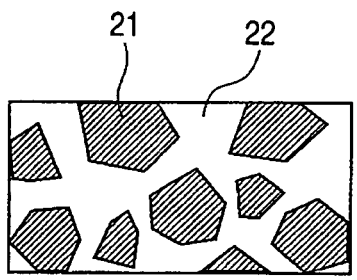
FIG. 2A1
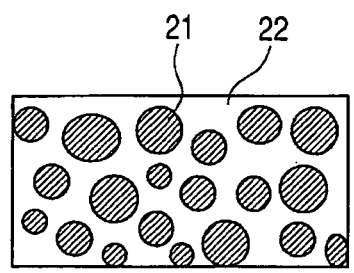
FIG. 2B1
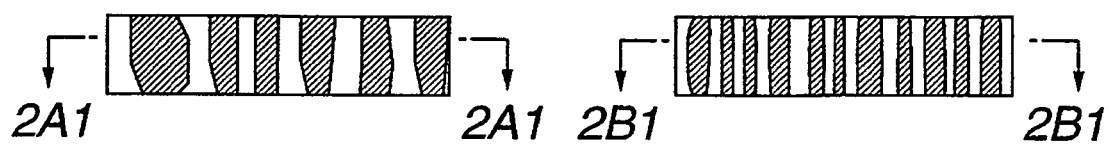
FIG. 2A2  FIG. 2B2
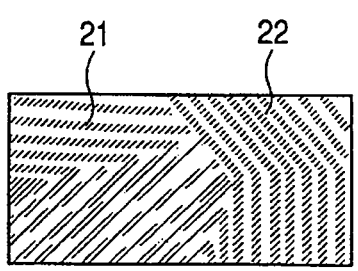
FIG. 2C1
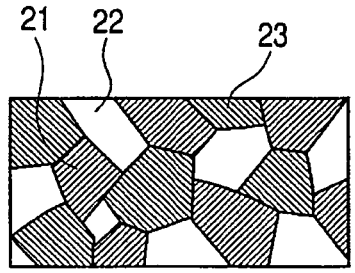
FIG. 2D1
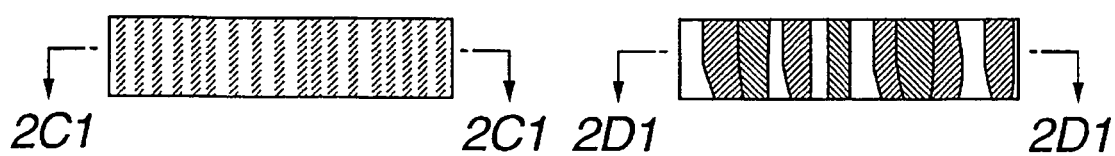
FIG. 2C2  FIG. 2D2

LIGHT EMITTING DEVICE HAVING LIGHT EMISSION AND MICROSTRUCTURE LAYERS BETWEEN ELECTRODE LAYERS

BACKGROUND OF THE INVENTION

1. Field of the Invention

The present invention relates to a light emitting device with an electrode layer, a light emitting layer and a microstructured layer, and its manufacturing method.

2. Related Background Art

A flat panel display (FPD) to which a light emitting device is applied, has been drawing attention. From the type of a light emitting device applied thereto, FPD is classified into an organic electroluminescence display (organic EL display), an inorganic electroluminescence display (inorganic EL display), a light emitting diode display (LED display), or the like.

LED can be driven under a low voltage, and is excellent in stability. However, since it is produced by a process using crystal growth requiring high temperature, it is difficult to be formed on a glass substrate or a plastic substrate. Thereby, the applicable range of a display is limited.

The organic EL display can be driven at a low voltage, and can be formed on a glass substrate or a plastic substrate, however, it has a problem in reliability or durability. In the inorganic EL display, a large area of display can be relatively easily produced, and high environmental resistance during usage can be expected, however, as it is now, there is a problem of high driving voltage.

Recently, in Japanese Patent Application Laid-Open No. 2003-115385, a technology of a light emitting device using a crystallized fine particle covered with insulated layer, for example, Si single crystal fine particle covered with SiO2 is disclosed. In Japanese Patent Application Laid-Open No. 2001-319787, a technology of a light emitting device using a porous polycrystal silicon layer is disclosed.

The present invention is intended to provide a novel light emitting device which can be operated at a low voltage, and which is excellent in luminous efficiency, stability, production cost, and so on. Also, it is intended to provide a method for manufacturing such a light emitting device.

SUMMARY OF THE INVENTION

According to the present invention, it is possible to provide a light emitting device which is excellent in luminous uniformity at the luminous surface, and can be driven stably under a relatively low voltage. Since, the light emitting device of the present invention is excellent in luminous uniformity at the luminous surface, and can be driven stably under a relatively low voltage, it is possible to utilize it for a display, a printing apparatus or a lighting apparatus.

According to an aspect of the present invention, there is provided a light emitting device comprising a substrate, a first electrode layer, a light emitting layer, a structure layer and a second electrode layer, which structure layer has first domains composed of a first material having the shape of column and second domains composed of a second material, and which device has on the substrate the structure layer and the light emitting layer which layers are laminated between the first electrode layer and the second electrode layer.

The structure layer (hereinafter also referred to as "microstructured layer") is preferably provided between the first electrode layer and the light emitting layer.

The domains composed of the first material are preferably columnar, and the domains composed of the second material are preferably located around the domains composed of the first material. The length of a short axis of the columnar domain is preferably 1 µm or less.

The domains composed of the first material are preferably arranged regularly.

The first material and the second material are preferably respectively oxides different from each other.

The light emitting device further comprising a third electrode layer, wherein the light emitting layer is provided between the second electrode layer and the third electrode layer.

According to another aspect of the present invention, there is provided an image display apparatus using the above light emitting device.

According to a still another aspect of the present invention, there is provided a manufacturing method of a light emitting device comprised of a substrate, an electrode layer, a light emitting layer and a microstructured layer having first domains composed of a first material and second domains composed of a second material which layers are laminated on the substrate, comprising the steps of:

forming the microstructured layer on the electrode layer, and then forming the light emitting layer on the microstructured layer. According to a further aspect of the present invention, there is provided a manufacturing method of a light emitting device comprised of a substrate, an electrode layer, a light emitting layer and a microstructured layer having first domains composed of a first material and second domains composed of a second material which layers are laminated on the substrate, comprising the steps of:

forming the microstructured layer on the light emitting layer, and then forming the electrode layer on the microstructured layer.

According to a further aspect of the present invention, there is provided a light emitting device comprising a substrate, an electrode layer, a light emitting layer and a structure layer having first domains composed of a first material having the shape of column and a second domain composed of a second material, wherein an electron is accelerated at an interface between the first domain and the second domain when a voltage is applied, to inject the electron into the light emitting layer.

According to a further aspect of the present invention, there is provided a light emitting device comprising a substrate, an electrode layer, a light emitting layer and a structure layer having first domains composed of a first material having the shape of column and a second domain composed of a second material, wherein the structure layer is in contact with one selected from the group consisting of the structure layer and the electrode layer.

The step for forming the microstructured layer preferably comprises a sputtering method.

BRIEF DESCRIPTION OF THE DRAWINGS

FIGS. 2A1, 2A2, 2B1, 2B2, 2C1, 2C2, 2D1 and 2D2 are schematical views showing constructional examples of the microstructured layer of the present invention;

DETAILED DESCRIPTION OF THE PREFERRED EMBODIMENT

Figure 1:
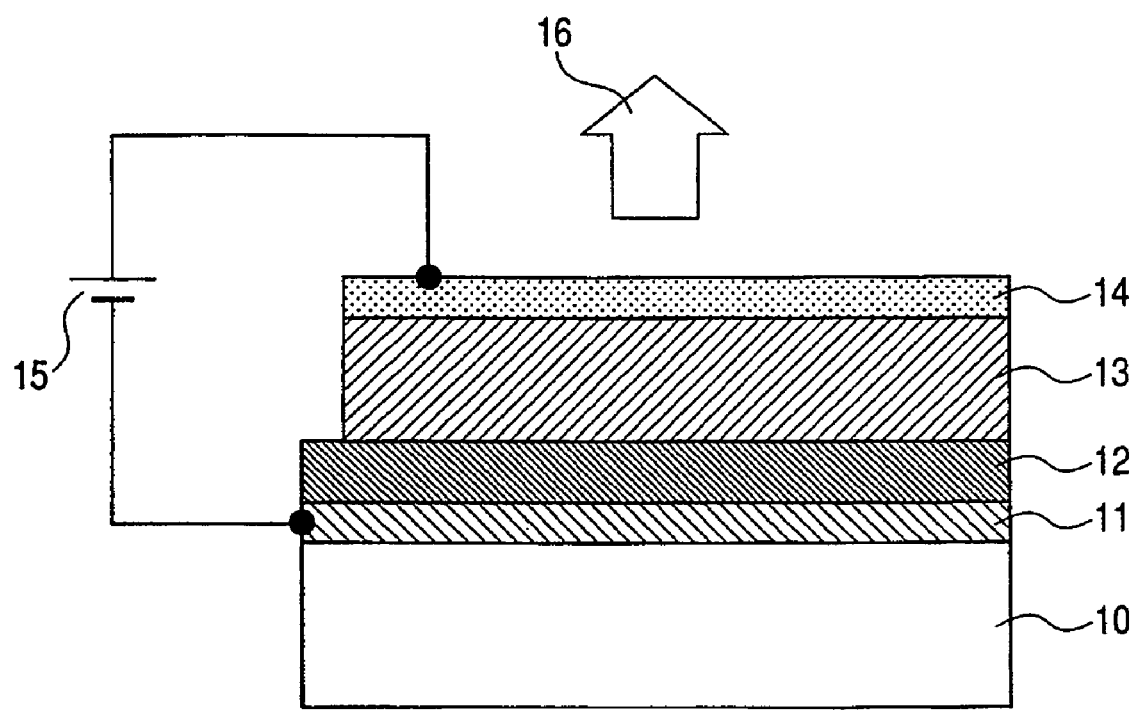
FIG. 1 is a schematical view showing the constitution of a light emitting device of the present invention (top-emission type)
Figure 4A:
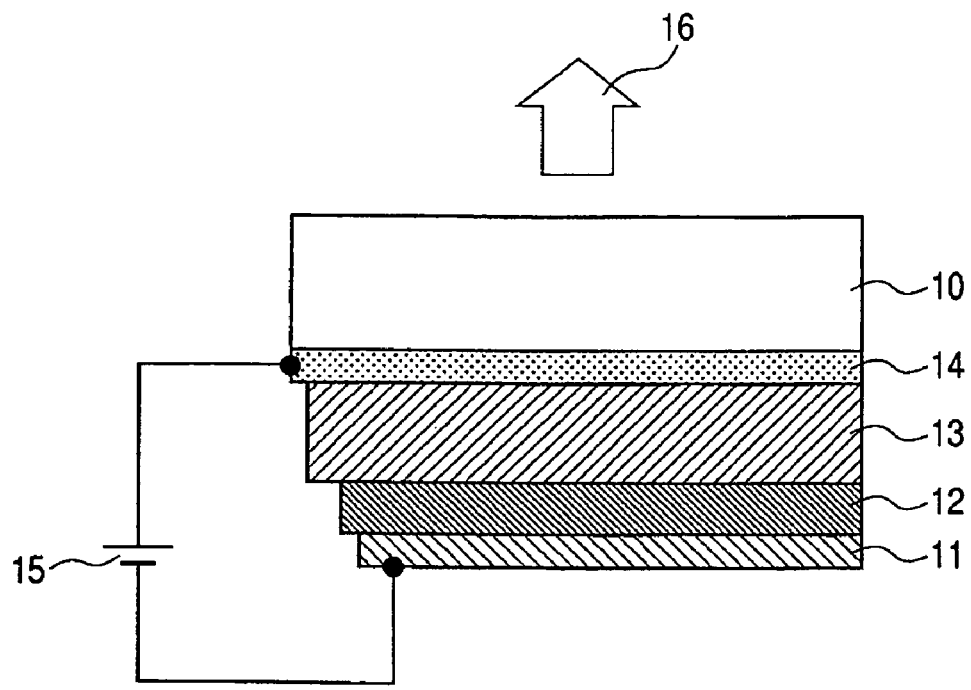
FIGS. 4A and 4B are schematical views showing the constitution of bottom-emission type of light emitting device of the present invention in which the light is taken out from the side of a substrate.
Figure 4B:
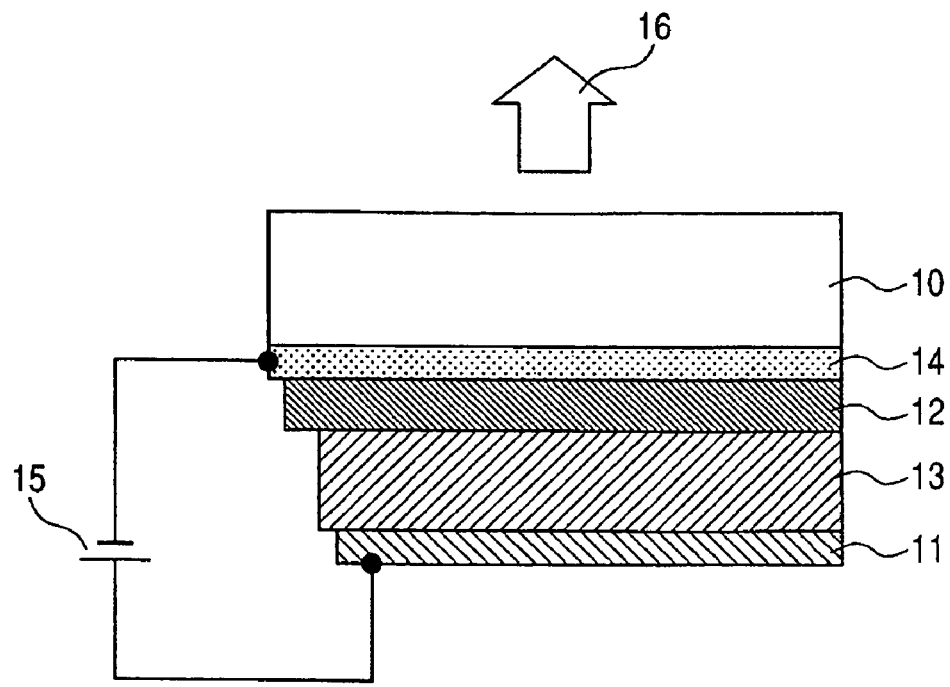

Now, using FIG. 1, FIG. 4A and FIG. 4B schematically showing the constitutions of light emitting devices of the present invention, the constitutions and aspects of the present invention will be described in detail below.

On a substrate 10, a first electrode layer 11, a microstructured layer 12, a light emitting layer 13 and a second electrode layer 14 are laminated. The first electrode layer 11 and the transparent electrode 14 are facing each other across microstructured layer 12 and light emitting layer 13. Since the second electrode layer 14 comprises a member that transmits light emitted from the light emitting layer (hereinafter described as transparent), hereinafter, the second electrode layer is referred to as "transparent electrode layer".

There are an aspect in which the first electrode layer 11 is provided in contact with substrate 10, as shown in FIG. 1, and an aspect in which transparent electrode layer 14 is provided in contact with substrate 10, as shown in FIGS. 4A and 4B. The substrate contacting the transparent electrode comprises a transparent member so as to emit light.

Moreover, there are an aspect in which microstructured layer 12 is located between light emitting layer 13 and the first electrode layer 11, thereby, light emitting layer 13 is located between microstructured layer 12 and transparent electrode layer 14, as shown in FIGS. 1 and 4A, and an aspect in which light emitting layer 13 is located between microstructured layer 12 and the first electrode layer 11, thereby, microstructured layer 12 is located between light emitting layer 13 and transparent electrode layer 14, as shown in FIG. 4B.

The first electrode layer 11 and transparent electrode layer 14 are electrically connected to the both electrodes of a drive power supply 15 such as a DC power supply, a pulsed power supply or an AC power supply. In FIGS. 1 and 4A, the first electrode layer 11 is a lower potential electrode, or the cathode, and in FIG. 4B, transparent electrode layer 14 is the cathode.

When a voltage is applied between both the electrodes, electrons are injected from the cathode to the light emitting layer 13 via microstructured layer 12, and excite it to emit light. The emitted light is emitted from the surface of a device composed of a transparent member, as shown by an arrow 16.

Now, microstructured layer 12 which is characteristic to the light emitting device of the present invention, will be described using schematical views of its top surface, FIGS. 2A1, 2B1, 2C1 and 2D1, and schematical views of its cross section, FIGS. 2A2, 2B2, 2C2 and 2D2.

Microstructured layer 12 comprises the matrix-structure of FIGS. 2A1, 2A2, 2B1, 2B2 and 2D1, 2D2 or the lamella-structure of FIGS. 2C1, and 2C2. In the matrix-structure, the columnar domains 21 composed of the first material (hereinafter referred to as "first material domains") are embedded in the domains (hereinafter referred to as "second material domains") 22 composed of the second material as shown in FIGS. 2A1, 2A2, 2B1, 2B2. In FIGS. 2A1 and 2A2, a case in which the first material domains has a shape having corner, is shown. In FIGS. 2B1 and 2B2, a case in which the first material domains are circular cylindrical, is shown.

As shown in FIGS. 2D1 and 2D2, it can include domains (hereinafter referred to as "third material domains") composed of a third material in a similar manner as in the first and second material domains.

It is preferable for the columnar domains 21 to be arranged such that its axis are in a direction perpendicular to the microstructured layer.

It is preferable for the sectional diameter of the domains 21 to be 1 nm or more and less than 1 μm. In the lamella-structure as shown FIGS. 2C1 and 2C2, it is preferable for their lamination directions to be in in-plain direction of the microstructured layer, and it is preferable for the lamination gap to be 1 nm or more and less than 1 μm.

Such a structure is preferable, because it can be produced by self-organizing technology by using an eutectic reaction.

The above mentioned microstructured layer allows for electrons to be injected uniformly and effectively over the entire region of the light emitting layer. Using FIGS. 3A and 3B, the reason will be described.

Figure 3A:
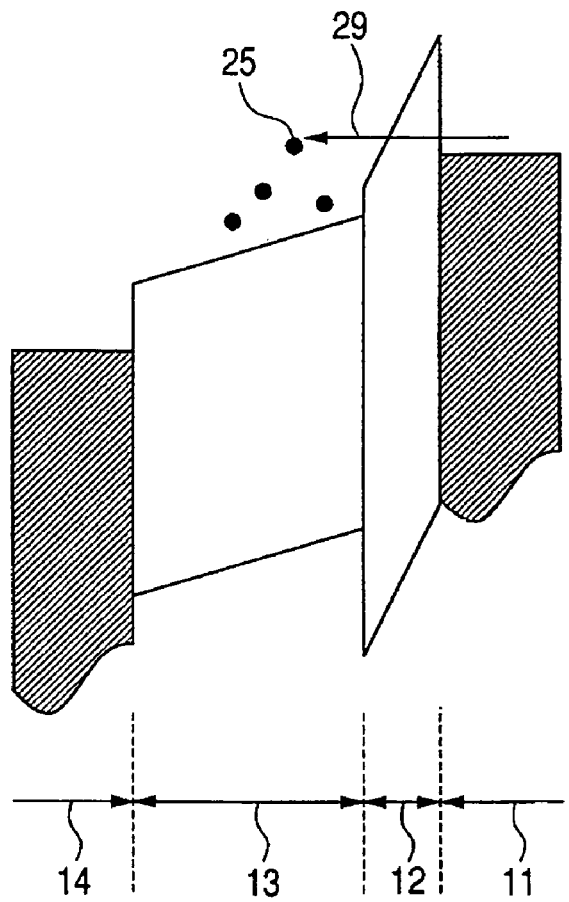
FIG. 3A is a schematical view showing depth profile of a potential to the electrons in the light emitting device of the present invention.
Figure 3B:
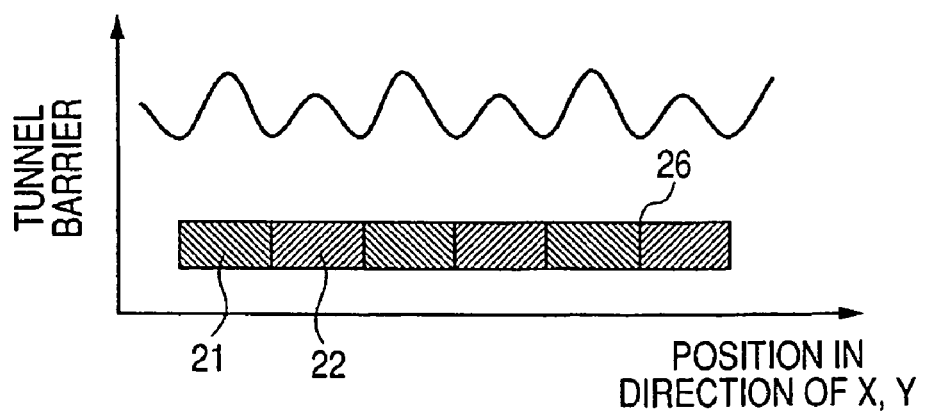
FIG. 3B is view showing a spatial distribution of the potential barrier (the tunnel barrier) in the light emitting device of the present invention.

FIG. 3A is a schematical view showing depth profile of a potential to the electrons. FIG. 3B is a schematical view showing the spatial distribution of tunnel barriers in the microstructured layer. The electrons 25 feel the potential like as shown in FIG. 3A, and injected into light emitting layer 13 from the first electrode layer 11 via microstructured layer 12, namely by tunneling. Since, as shown in FIG. 3B, the tunnel barrier is relatively low at the boundaries 26 between the first material domains 21 and the second material domains 22, the electrons can tunnel easily at the boundaries. In the microstructured layer with the above mentioned structure, such domain boundaries with a low tunnel barrier are distributed uniformly and in high density over the entire microstructured layer, thereby resulting in that electrons can be uniformly injected (pass through the boundaries) to the entire light emitting layer.

Moreover, since the above mentioned structure of the microstructured layer have such domains with a low tunnel barrier, the electrons can be accelerated preferentially there, thereby, such a device can operate under a relatively low driving voltage.

Moreover, since the above mentioned structure of the microstructured layer have such domains uniformly in its plane, thereby, dielectric breakdown accompanied with the energy concentration at local point of the device will not occur easily. In this manner, it is possible to cause the light emitting device to be excellent in reliability and stability.

The thickness of the microstructured layer is in a range from several nm to several hundred nm.

If the thickness is several nm and it is thinner than the mean free paths of the electrons, the electrons arrive at the light emitting layer by directly tunneling through the insulating microstructured layer. Such a device can be driven at a low voltage.

If the thickness is several dozen nm-several hundred nm, and it is thicker than the mean free paths of the electrons, the electrons become hot electrons to be accelerated in the microstructured layer, and arrive at the light emitting layer. In the above mentioned microstructured layer having the structure of the present invention, effective electron acceleration via the interface state at the boundary between the first material domains and the second material domains can be expected. In such a device, the driving voltage becomes rather higher, however, it is relatively easy to cause the property deviation between devices to be small. In this case, as mentioned above, since the microstructured layer also has a high density of domains in which hot electrons are generated preferentially, thereby, it is possible to cause light to be emitted in the plane uniformly.

Causing the sizes of the first and second material domains of the microstructured layer to be small will increase the boundary parts, or the domains to be easily tunneled through, thereby, leads to the increase of the luminous points. This is preferable from the view of the in-plain uniformity of the luminous property. It is preferable for the domain sizes to be 1 µm or less, more preferably, to be 100 nm or less.

In order to form the large number of luminous points in a plane uniformly, a structure in which the first material domains are distributed and regularly arranged among the second material domains, is preferable. It is further preferable, that the first material domains and the second material domains are present in the same period each other.

To cope with both the high insulating property at an off-state under a low voltage, and the effective electron acceleration at an on-state during light emission under a high voltage, it is preferable for the microstructured layer to be composed of oxides. It also can be an organic material. Specifically, materials such as $Al_2O_3$, $SiO_2$, $ZnO_2$, $TiO_2$, $HfO_2$, $Ta_2O_5$, SiN, GaN, $BaTiO_3$ and ZnO, are listed as materials for the domains composed of a first material and the domains composed of a second material.

Figure 7:
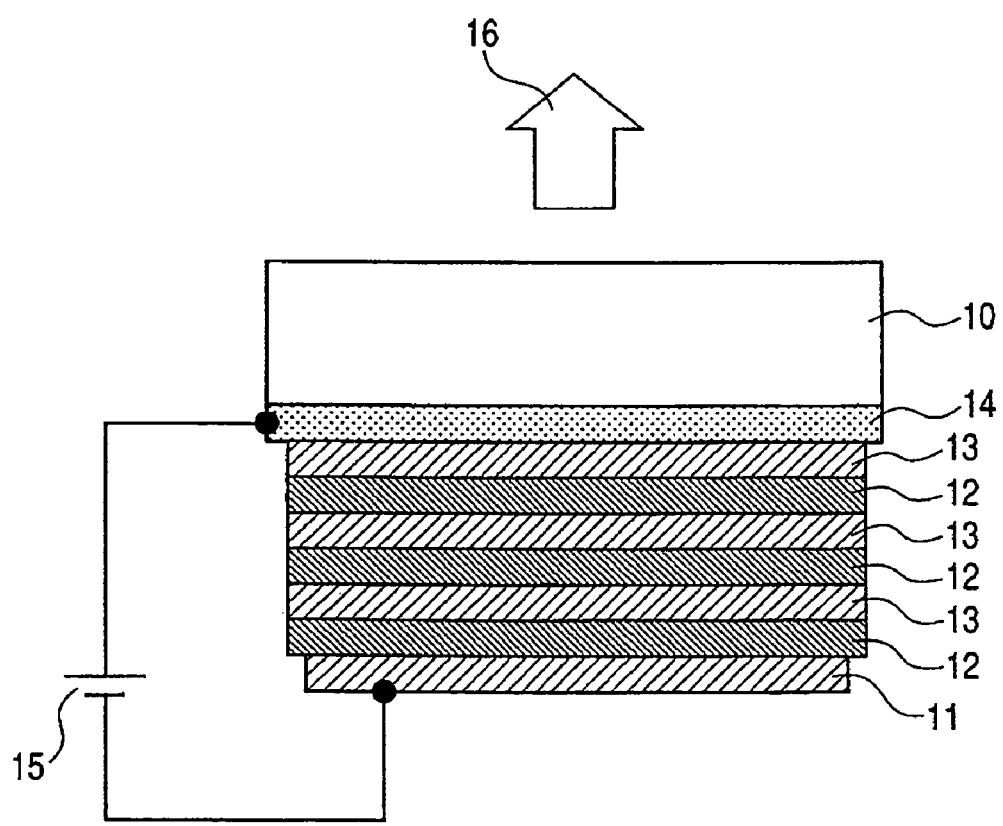
FIG. 7 is a schematical view showing the constitution of a light emitting device of the present invention in which light emitting layers and microstructured layers are laminated one after another.

As in FIG. 7, a plurality of microstructured layers and light emitting layers can be laminated alternately.

Now, the respective layers of the light emitting device of the present invention will be described below.

In the case of bottom-emission device as shown in FIGS. 4A and 4B, the substrate 10 is composed of a transparent material of glass or plastic so as to cause light to transmit therethrough. In the case of top-emission device as shown in FIG. 1, the substrate 10 is not required to be transparent, and ceramics, semiconductor substrates or the like, as well as glasses or plastics can be utilized.

It is preferable for transparent electrode layer 14 to have both functions of conductivity acting as an electrode, and transparency for being transmitted by emitted light. As a material of the transparent electrode layer, transparent conductive films such as doped $In_2O_3$ or $SnO_2$, ZnO and ITO (indium tin oxide) are listed.

As material of the electrode layer 11, various kinds of metals such as Al, Au, Pt, Ag, Ta and Ni, alloys or transparent conductive films are available.

Light emitting layer 13 is a layer which presents light emission during being driven. Light emitting layer 13 has a thickness of 50 nm to 1 µm. The material constituting the light emitting layer can be a material which presents light emission. For example, as a luminescent material having a luminescence center, ZnS:Mn, SrS:Ce, Eu, CaS:Eu, ZnS:Tb, F, CaS:Ce, SrS:Ce, $CaGa_2S_4$:Ce, $BaAl_2S_4$:Eu, $Ga_2O_3$:Eu, $Y_2O_3$:Eu, $Zn_2SiO_4$:Mn, $ZnGa_2O_4$:Mn, $Y_2O_2S$:$Eu^{3+}$, $Gd_2O_2S$:$Eu^{3+}$, $YVO_4$:$Eu^{3+}$, $Y_2O_2S$:Eu, Sm, $SrTiO_3$:Pr, $BaSi_2Al_2O_8$:$Eu^{2+}$, $BaMg_2Al_{16}O_{27}$:$Eu^{2+}$, $Y_{0.65}Gd_{0.35}BO_3$:$Eu^{3+}$, $La_2O_2S$:$Eu^{3+}$, Sm, $Ba_2SiO_4$:$Eu^{2+}$, $Zn(Ga,Al)_2O_4$:Mn, $Y_3(Al,Ga)_5O_{12}$:Tb, $Y_2SiO_5$:Tb, ZnS:Cu, $Zn_2SiO_4$:Mn, $BaAl_2Si_2O_8$:$Eu^{2+}$, $BaMgAl_{14}O_{23}$:$Eu^{2+}$, $Y_2SiO_5$:Ce, $ZnGa_2O_4$, or the like are listed. Further, tungsten oxide such as $ZnWO_4$ or $MgWO_4$, molybdenum oxide such as $ZnMoO_4$ or $SrMo_4$, vanadium oxide such as $YVO_4$, europium oxide such as $Eu_2SiO_4$ or $EuSiO_4$ are listed. Other material such as an organic luminescent material such as Alq3 (aluminium quinoline complex) or Ir(ppy) (fac-tris (2-phenypyridine) iridium(III)), a semiconductor material such as ZnSe, CdSe, ZnTe, GaP, GaN, or ZnO, and further fine particles of them can be used.

Now, the manufacturing of the light emitting device of the present invention will be described.

For the film formation of the microstructured layer, the light emitting layer, the transparent conductive layer and the electrode layer, any thin film forming method, such as a gaseous-phase method such as vacuum vapor deposition, sputtering, or electron beam evaporation, a liquid-phase method such as plating, and a solid-phase method such as a sol-gel method, can be used.

Specifically, for producing a microstructured layer using a eutectic reaction, the sputtering method, which can supply high energy particles to a substrate, is a preferable method.

For example, the following steps are listed. First a target composed of a mixture of Al and Si is arranged facing to a substrate 10. Next, a matrix-structure composed of Al and Si, in which cylindrical domains composed of mainly Al with a cross sectional diameter of 1 to 20 nm are embedded in the domain composed of mainly Si at intervals of 5 to 30 nm (hereinafter, such a structure before subjected to a treatment such as anodic oxidation for finally obtaining a microstructured layer, is referred to as a "Al—Si matrix"), is formed by a magnetron sputtering method. By changing the composition ratio of Al and Si of the target mixture, the ratio of Al domains and Si domains in the Al—Si matrix can be controlled.

Then, the obtained Al—Si matrix is subjected to anodic oxidization to obtain a microstructured layer composed of first material domains composed mainly alumina in the shape of circular cylindrical column, and based second material domains composed of mainly silicon oxide, as shown in FIGS. 2B1 and 2B2. The second material domains may have non-oxidized Si partially.

EXAMPLES

The present invention is not limited to the following examples, rather it includes anything contained in the above mentioned concept.

Example 1

The light emitting device of this example comprises the structure described in FIG. 1. Microstructured layer 12 has the structure shown in FIG. 2B1 and 2B2, the first material is based on alumina, and the second material is based on silicon oxide.

Now, description will be made following the production steps.

[Formation of a First Electrode Layer]

A quartz substrate is prepared as a substrate 10. As a first material electrode layer 11, a Ta film with a thickness of 100 nm is formed on substrate 10 by a magnetron sputtering method.

[Formation of a Microstructured Layer]

A film of Al—Si matrix was formed on the first electrode layer at room temperature by a magnetron sputtering method. A target having a Al and Si composition ratio of (56:44) was used and an input power is 150 W. The Al—Si matrix comprises a matrix-structure, in which circular cylindrical columnar aluminum domains with a sectional diameter of about 7 nm are embedded in a matrix composed of Si at intervals of about 10 nm. The thickness of the film is about 7 nm. Next, the Al—Si matrix as an anode, and a platinum electrode as a cathode are arranged facing each other in 0.1 M aqueous ammonium tartrate solution, and subjected to anodic oxidation at a voltage of about 5 V. In this manner, aluminum and Si are oxidized to alumina and silicon oxide. Thereby, a microstructured layer 12, in which circular cylindrical columnar domains composed of mainly alumina with a diameter of about 7 nm are embedded in the matrix of second material domain composed of silicon, is obtained. The microstructured layer 12 has a thickness of about 7 nm.

[Formation of a Light Emitting Layer and a Transparent Electrode Layer]

Next, a film of Alq3 (aluminium quinoline complex) with a thickness of 80 nm is formed as a light emitting layer 13, and further a film of ITO, 5% Sn added $In_2O_3$ with a thickness of 200 nm is formed as a transparent electrode 14.

[Light Emission Test]

The transparent electrode film 14 and the first electrode layer 11 were electrically connected to the anode and the cathode of the pulsed voltage source, respectively, which is a drive power supply. A pulsed voltage with a pulse width of 1 ms and a repetition frequency of 50 Hz is applied. As the voltage is increased gradually, the light was emitted from the device around 20 V. A uniform light emission was obtained in the device plane, and the stability was also good.

Example 2

The light emitting device of the present invention comprises the structure described in FIG. 4B. Microstructured layer 12 has the structure shown in FIGS. 2B1 and 2B2, and its first material is based on iron oxide, and its second material is based on silicon oxide.

Now, description will be made following the production steps.

[Formation of a Transparent Electrode Layer]

As substrate 10, a quartz substrate was used. An ITO film with a thickness of 200 nm was formed on substrate 10 by a magnetron sputtering method as a transparent electrode layer 14.

[Formation of a Microstructured Layer]

Next, a microstructured layer is formed on the transparent electrode layer 14 by a magnetron sputtering method, in which the target composed of a mixture of FeO powder and $SiO_2$ powder with a volume ratio, $FeO:SiO_2=3:7$ is used.

Next, the obtained structure is subjected to a heat treatment at 600° C. under an air atmosphere.

Thereby, the microstructured layer 12, in which circular cylindrical columnar domains composed of mainly iron oxide with a sectional diameter of about 4 nm are embedded in a matrix composed of silicon oxide and Si, is obtained. The thickness of microstructured layer is about 50 nm.

[Formation of a Light Emitting Layer and a First Electrode Layer]

Next, a film of (ZnS:Mn) was formed by electron beam evaporation, and subjected to heat treatment at 500° C. under an air atmosphere to form a light emitting layer 13 with a thickness of about 100 nm. Further an Au film with a thickness of 200 nm was formed as a first electrode layer 11.

[Light Emission Test]

The transparent electrode film 14 and the first electrode layer 11 were electrically connected to the cathode and the anode of the pulsed voltage source, respectively, which is a drive power supply. A pulsed voltage with a pulse width of 1 ms and a repetition frequency of 50 Hz is applied. As the voltage is increased gradually, the light was emitted from the substrate side of the device around 50 V. A uniform light emission was obtained in the device plane, and the stability was also good.

Example 3

Figure 5:
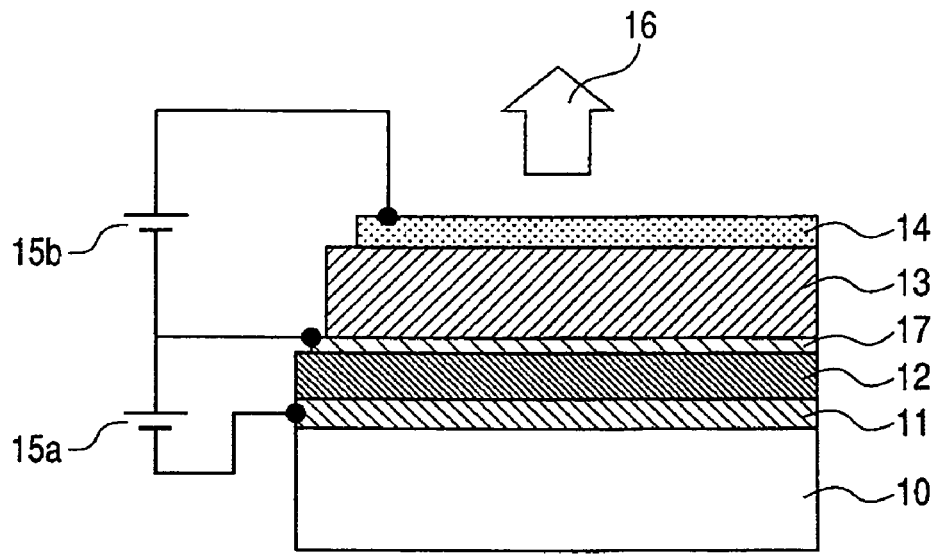
FIG. 5 is a schematical view showing the constitution of a light emitting device of the present invention having a third electrode layer.

The light emitting device of the present invention comprises a structure described in FIG. 5. Reference numeral 17 denotes a third electrode layer, reference numeral 15a denotes a drive power supply, and reference numeral 15b denotes a second power supply. Electrons accelerated between the first electrode layer 11 and third electrode layer 17 are transmitted through the third electrode layer and injected into light emitting layer 13. Thus, the light emission layer is excited, thereby, light emission occurs.

[Formation of a First Electrode Layer and a Microstructured Layer]

A first electrode layer 11 and a microstructured layer 12 are formed on substrate 10, in a similar manner as in example 1.

[Formation of a Third Electrode Layer]

Next, as a third electrode layer 17, an Al film or an Au film with a thickness of 5 nm order is formed. In order to be transmitted by electrons, it is preferable for the layer to be thin as long as it acts as an electrode.

[Formation of a Light Emitting Layer and a Transparent Electrode Layer]

Next, as a light emitting layer 13, a film of ZnS:Mn is formed by electron beam evaporation, and subjected to heat treatment at 500° C. under an air atmosphere. The thickness is about 300 nm. Next, an ITO film with a thickness of 200 nm is formed as a transparent electrode layer 14.

[Light Emission Test]

The transparent electrode film 14 and the third electrode layer are electrically connected to the anode and the cathode of a second power supply 15b, respectively. The third electrode layer and the first electrode layer are electrically connected to the anode and the cathode of a drive power supply 15a, respectively. The second power supply 15b is a DC voltage source, and the drive power supply 15a is a pulsed voltage source. DC voltage of 100V is applied between the transparent electrode film 14 and third electrode layer 17, and a pulsed voltage with a pulse width of 1 ms and a repetition frequency of 50 Hz was applied between the third electrode layer and the first electrode layer. As the pulsed voltage is increased gradually, the light was emitted from the device around 16 V.

According to the present invention, by controlling a pulsed power supply, the on-off of light emission can be controlled by a small voltage amplitude.

Example 4

Figure 6:
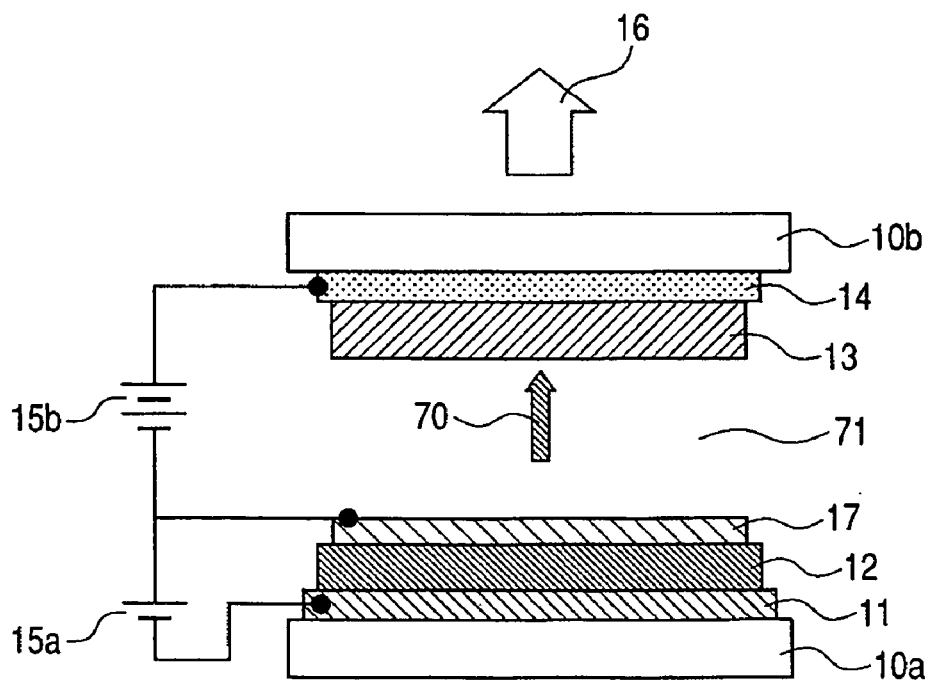
FIG. 6 is a schematical view showing the constitution of a light emitting device of the present invention using an electron beam.

This example is an example of such a type of light emitting device that is caused to emit light by electron beam excitation. The configuration is shown in FIG. 6. Reference numerals 10a and 10b denote substrates, reference numeral 70 denotes an electron beam, and reference numeral 71 denotes a vacuum.

The light emitting device of this example comprises an electron emitting element in which a first electrode layer 11, a microstructured layer 12, and a third electrode layer 17 are laminated on a substrate 10a, and a substrate 10b having a light emitting layer 13, which are arranged facing each other. After passing through third electrode layer 17, electrons accelerated by an electric field between the first electrode layer 11 and third electrode layer 17, are emitted into the vacuum 71. The emitted electrons are accelerated by a voltage applied between third electrode layer 17 and transparent electrode layer 14, and irradiated on light emitting layer 13 as an electron beam 70. In this manner, light emitting layer 13 is excited, and light emission occurs.

[Formation of a First Electrode Layer, a Microstructured Layer, and a Third Electrode Layer]

A first electrode layer 11, a microstructured layer 12 and a third electrode layer 17 are formed, in a similar manner as in example 3.

[Formation of a Transparent Electrode Layer and a Light Emitting Layer]

A film with a thickness of 300 nm of a transparent electrode layer 14 of ($SnO_2$:F) is formed on the glass substrate 10b, on which a film with a thickness of 600 nm of ($Y_2O_3$:Eu) is formed as a light emitting layer 13. Further, an aluminum film (no shown) with a thickness of 50 nm, which bears roles for preventing charge up and for reflecting light from the light emitting layer, is formed.

[Light Emission Test]

Transparent electrode layer 14 and the third electrode layer are electrically connected to the anode and the cathode of a second power supply 15b, respectively, on the other hand, the third electrode layer and the first electrode layer are electrically connected to the anode and the cathode of a drive power supply 15a, respectively. The second power supply 15b is a DC voltage source, and the drive power supply 15a is a pulsed voltage source. DC voltage of 100V is applied between the transparent electrode film 14 and third electrode layer 17, and a pulsed voltage with a pulse width of 1 ms and a repetition frequency of 50 Hz is applied between third electrode layer 17 and the first electrode layer. As increased the pulsed voltage gradually, the light is emitted from the device around 16 V.

According to the present invention, by controlling a pulsed power supply, the on-off of relatively stronger light emission can be controlled by small voltage amplitude.

Example 5

The light emitting device according to this example comprises the structure described in FIG. 4A. Microstructured layer 12 has the lamella-structure shown in FIGS. 2C1 and 2C2, in which lamellas of $ZrO_2$ and $Al_2O_3$ are laminated alternately.

[Formation of a Transparent Electrode Layer]

As a substrate 10, a YSZ (yttria-stabilized zirconia) single crystal substrate (111) is used. An ITO film with a thickness of 300 nm is formed on substrate 10 to be as a transparent electrode layer 14 by a magnetron sputtering method at a substrate temperature of 700° C.

[Formation of a Light Emitting Layer]

Next, a mixed target of a ZnO target and $WO_3$ target is prepared, a film with a thickness of 200 nm of compound oxide of Zn and W is formed by a magnetron sputtering method, at a substrate temperature of about 800° C. during film formation, at a gas pressure of 0.5 Pa, and under a mixed atmosphere of Ar and $O_2$ with a flow rate of (Ar:$O_2$=5:2). The obtained film is caused to be as a light emitting layer 13.

[Formation of a Microstructured Layer]

Next, as a microstructured layer 12, a film of an oxide structure of Zr and Al with a thickness of 20 nm will be formed as follows:

Preparing a $ZrO_2$ target containing 8 mol % $Y_2O_3$ and an $Al_2O_3$ target, and a film are binary and simultaneously formed by a magnetron sputtering method. The film formation is performed at a substrate temperature of about 800° C., and under a mixed atmosphere of Ar and $O_2$. The gas pressure is 0.5 Pa, and the flow rate of Ar and $O_2$ is (5:2). The input powers to the respective targets are adjusted so that the composition ratio of Zr and Al in the formed film becomes about (1:4). The thin film has a thickness of 20 nm, in which, as shown in FIGS. 2C1 and 2C2, $ZrO_2$ based domains and $Al_2O_3$ based domains are arranged lamellarly. The width of the $ZrO_2$ region is about 50 nm. The width of the $Al_2O_3$ region is about 60 nm.

[Formation of a First Electrode Layer]

A film of Al with a thickness of 200 nm is formed by vacuum evaporation, and caused to be as a first electrode layer 11.

[Light Emission Test]

Transparent electrode layer 14 and the first electrode layer 11 are electrically connected to the anode and the cathode of the pulsed voltage source, respectively, which is a drive power supply. A pulsed voltage with a pulse width of 1 ms and a repetition frequency of 50 Hz is applied. As increased the voltage gradually, the light is emitted from the substrate side of the device around 60 V. A uniform light emission is obtained in the device plane, and the stability is also good.

Example 6

The light emitting device according to this example comprises the structure described in FIG. 7A. It is an example in which microstructured layers 12 and light emitting layers 13 are repeatedly laminated one after another.

[Formation of a Transparent Electrode Layer, a Light Emitting Layer and a Microstructured Layer]

After forming a transparent layer 14 on a YSZ single crystal substrate, three light emitting layers 13 and three microstructured layers 12 are formed by repeatedly laminated alternately. The thickness of light emitting layer 13 and microstructured layer 12 are 80 nm and 50 nm, respectively.

A first transparent layer 14, a microstructured layer 12 and light emitting layers 13 are formed in a similar manner as in example 5.

[Formation of a First Electrode Layer]

As a first electrode layer 11, a film of Al with a thickness of 200 nm was formed by vacuum evaporation.

[Light Emission Test]

The transparent electrode film 14 and the first electrode layer 11 were electrically connected to the anode and the cathode of the pulsed voltage source, respectively, which is a drive power supply. A pulsed voltage with a pulse width of 1 ms and a repetition frequency of 50 Hz is applied. As increased the voltage gradually, light was emitted from the substrate side of the device around 90 V. A uniform light emission is obtained in the device plane, and the stability was also good.

Example 7

Examples of the light emitting device applied as an image display apparatus, a lighting apparatus, and a printing apparatus will be described.

In order to use the light emitting device in the example 1 as an image display apparatus, electrodes are wired in a matrix above and below in a line to be driven. In order to obtain a color image, a color is picked up with an RGB filter using a white luminescent material, or a film of a luminescent material corresponding to the RGB is patterned and formed with high precision. It is also possible to convert a color from blue to green or red by a fluorescent material, using a blue luminescent material.

As for a method for using the light emitting device of the present invention as a lighting apparatus, there are a method for using a white luminescent material, a method for vertically laminating a RGB luminescent material, and a method for converting a blue or ultraviolet light into the light emission of RGB after causing them to be emitted.

In order to apply the present invention to a printer such as a printing apparatus, instead of scanning a laser light using a polygon mirror, the light emitting devices are aligned in a line to be driven.

This application claims priority from Japanese Patent Application No. 2005-077862 filed Mar. 17, 2005, which is hereby incorporated by reference herein.

What is claimed is:

1. A light emitting device, comprising:
   a substrate;
   a pair of electrode layers provided on the substrate,
   a microstructure layer provided between the electrode layers and in contact with a first one of the electrode layers;
   a light emitting layer provided between the electrode layers and in contact with a second one of the electrode layers;
   wherein the microstructure layer and the light emitting layer are in contact with each other, and the microstructure layer has first domains composed of a first material having a columnar shape and second domains composed of a second material, and
   wherein the first material and the second material are respectively oxides different from each other.

2. The light emitting device according to claim 1, wherein the microstructure layer is provided between one of the electrode layers and the light emitting layer.

3. The light emitting device according to claim 2, further comprising a third electrode layer, wherein the light emitting layer is provided between the second electrode layer and the third electrode layer.

4. The light emitting device according to claim 1, wherein the domains composed of the first material are embedded in the domains composed of the second material.

5. The light emitting device according to claim 4, wherein the size of the columnar domain is 1 μm or less.

6. The light emitting device according to claim 4, wherein the domains composed of the first material are arranged regularly.

7. An image display apparatus using the light emitting device according to claim 1.

8. A light emitting device according to claim 1, wherein an electron is injected from one of the electrode layers to the light emitting layer via the microstructure layer, and the electron is accelerated at an interface between the first domain and the second domain in the microstructure layer and injected.

9. A light emitting device according to claim 1, wherein the first domains composed of a first material having a columnar shape extend in upper and lower regions of the structure layer.

10. A light emitting device according to claim 1, further comprising a plurality of light emitting layers and a plurality of microstructure layers, wherein the light emitting layers and the microstructure layers are alternately laminated and disposed between the first electrode layer and the second electrode layer.

11. The light emitting device according to claim 1, wherein the first material and the second material are selected from a group of $Al_2O_3$, $SiO_2$, $ZnO_2$, $TiO_2$, $HfO_2$, $Ta_2O_5$, $BaTiO_3$, $ZnO$, $FeO$ and $ZrO_2$.

* * * * *